United States Patent
Makihara et al.

(10) Patent No.: US 10,008,961 B2
(45) Date of Patent: Jun. 26, 2018

(54) POWER GENERATING DEVICE

(71) Applicants: National University Corporation Tohoku University, Sendai-shi, Miyagi (JP); Murata Manufacturing Co., Ltd., Nagaokakyo-shi, Kyoto-fu (JP)

(72) Inventors: Kanjuro Makihara, Sendai (JP); Hitoshi Sakaguchi, Nagaokakyo (JP); Chikahiro Horiguchi, Nagaokakyo (JP)

(73) Assignees: NATIONAL UNIVERSITY CORPORATION TOHOKU UNIVERSITY, Sendai-Shi, Miyagi (JP); MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 358 days.

(21) Appl. No.: 15/012,981

(22) Filed: Feb. 2, 2016

(65) Prior Publication Data

US 2016/0156284 A1 Jun. 2, 2016

Related U.S. Application Data

(63) Continuation of application No. PCT/JP2014/063319, filed on May 20, 2014.

(30) Foreign Application Priority Data

Aug. 13, 2013 (JP) ................. 2013-168141

(51) Int. Cl.
*H01L 41/113* (2006.01)
*H02N 2/18* (2006.01)

(52) U.S. Cl.
CPC ............ *H02N 2/181* (2013.01); *H02N 2/188* (2013.01); *H01L 41/1136* (2013.01)

(58) Field of Classification Search
CPC ..... H01L 41/113; H01L 41/1134; H02N 2/18; H02N 2/181; H02N 2/188
See application file for complete search history.

(56) References Cited

U.S. PATENT DOCUMENTS

| | | | | |
|---|---|---|---|---|
| 8,354,778 B2* | 1/2013 | Arnold | ................ | H02K 7/1892 310/370 |
| 9,608,548 B2* | 3/2017 | Tabata | ................ | H02N 2/181 |
| 9,882,511 B2* | 1/2018 | Horiguchi | ............ | H02N 2/181 |
| 2005/0253486 A1* | 11/2005 | Schmidt | ............ | H01L 41/1136 310/329 |
| 2010/0079034 A1 | 4/2010 | Ramadass et al. | | |

(Continued)

FOREIGN PATENT DOCUMENTS

| | | | | |
|---|---|---|---|---|
| EP | 2579440 A1 * | 4/2013 | ............ | H02N 2/181 |
| JP | 2009-524387 A | 6/2009 | | |

(Continued)

OTHER PUBLICATIONS

International Search Report for PCT/JP2014/063319 dated Aug. 19, 2014.

(Continued)

*Primary Examiner* — J. San Martin
(74) *Attorney, Agent, or Firm* — Arent Fox LLP

(57) ABSTRACT

A power generating device is disclosed that includes a power generating unit, an inductor, a switch connected to the inductor in series, and a control circuit. The power generating unit includes a piezoelectric element, and upper and lower electrodes disposed on surfaces of the piezoelectric element. The inductor is electrically connected to the electrodes in parallel, with the inductor and a capacitance component constituting a resonance circuit. The control circuit has a driving mode in which it controls the switch to an ON state in synchronism with the voltage generated in the piezoelectric element becoming a peak value. Further, in a rest mode, the control circuit controls the switch to be in an OFF state when the voltage generated in the piezoelectric element has the peak value.

20 Claims, 12 Drawing Sheets

(56) References Cited

U.S. PATENT DOCUMENTS

| | | |
|---|---|---|
| 2010/0133954 A1 | 6/2010 | Despesse et al. |
| 2012/0068576 A1 | 3/2012 | Lee |
| 2012/0126666 A1 | 5/2012 | Tabata et al. |
| 2012/0212101 A1 | 8/2012 | Tabata et al. |
| 2014/0062256 A1* | 3/2014 | Buss ............... H02N 2/181 |
| | | 310/319 |
| 2014/0062257 A1 | 3/2014 | Tabata et al. |
| 2015/0043748 A1 | 2/2015 | Sudo |
| 2015/0303835 A1* | 10/2015 | Katsumura ......... H01L 41/1136 |
| | | 310/329 |

FOREIGN PATENT DOCUMENTS

| | | |
|---|---|---|
| JP | 2012-55533 A | 3/2012 |
| JP | 2012-105518 A | 5/2012 |
| JP | 2012-110143 A | 6/2012 |
| JP | 2012-175712 A | 9/2012 |
| JP | 2012-254005 A | 12/2012 |
| JP | 2012-264005 A | 12/2012 |

OTHER PUBLICATIONS

Ramadass et al. An Ellicient Energy Piezoelectric Harvesting Interface Circuit Using A Bias-Flip Rectifer and Shared Inductor, IEEE Journal of Solid-State Circuits, vol. 45, No. 1, Jan. 2010.
Written Opinion for PCT/JP2014/063319 dated Aug. 19, 2014.
Ramadass et al. An Efficient Energy Harvesting Interface Circuit Using A Bias-Flip Rectifer and Shared Inductor, IEEE Journal of Solid-State Circuits, vol. 45, No. 1, Jan. 2010.
Written Opinion for PCT/JP2017/063319 dated Aug. 19, 2014.

* cited by examiner

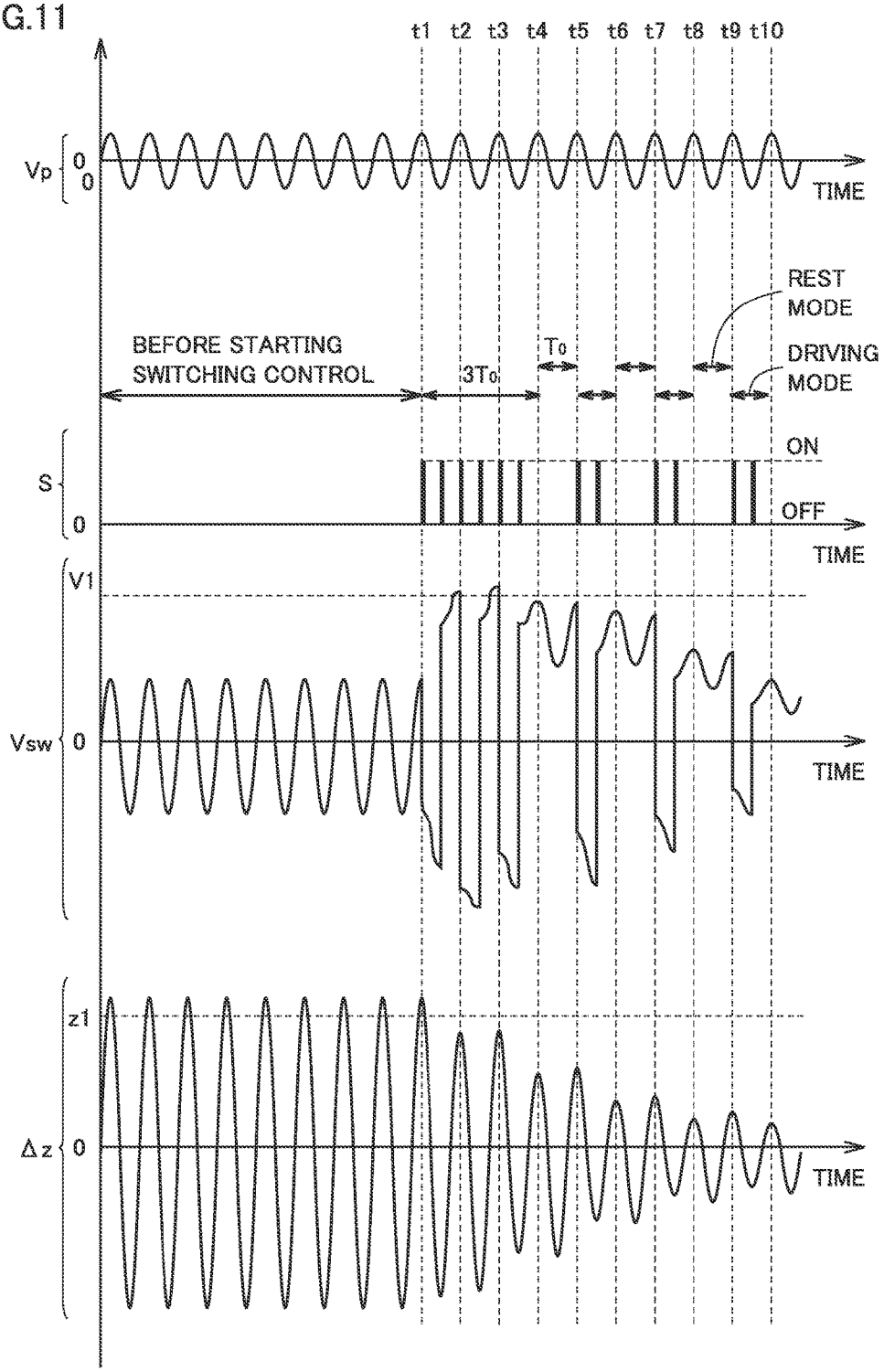

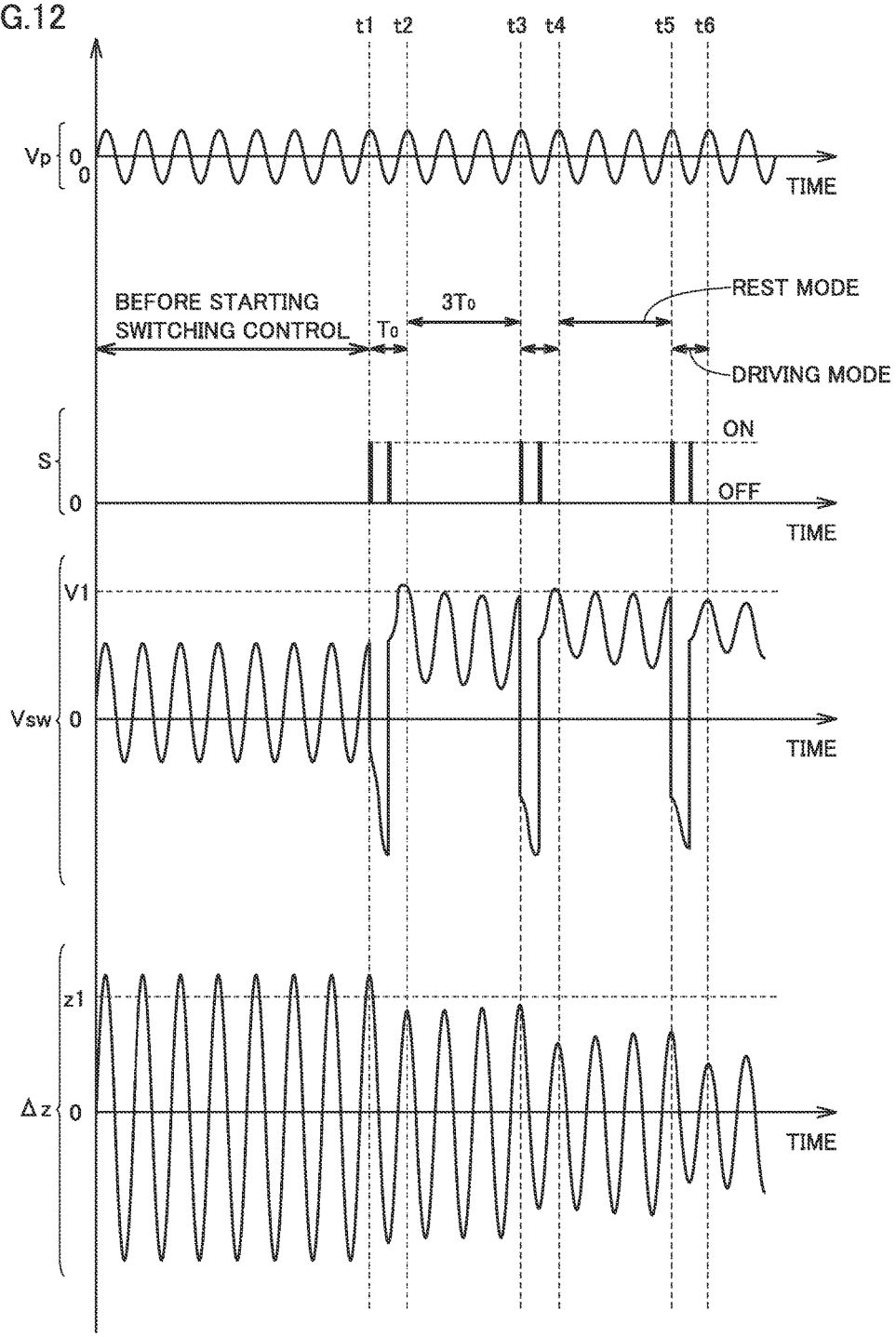

| 13a | ALWAYS IN DRIVING MODE |
| --- | --- |
| 13b | REPEAT ONE CYCLE OF DRIVING MODE AND ONE CYCLE OF REST MODE |
| 13c | REPEAT ONE CYCLE OF DRIVING MODE AND THREE CYCLES OF REST MODE |
| 13d | NO SWITCHING CONTROL (ALWAYS IN REST MODE) |

POWER GENERATING DEVICE

CROSS-REFERENCE TO RELATED APPLICATIONS

The present application is a continuation of PCT/JP2014/063319, filed May 20, 2014, which claims priority to Japanese Patent Application No. 2013-168141, filed Aug. 13, 2013, the entire contents of each of which are incorporated herein by reference.

TECHNICAL FIELD

The present invention relates to a power generating device, particularly, a power generating device including a piezoelectric body.

BACKGROUND

A technique of generating electric power using a piezoelectric effect of a piezoelectric body has been developed. For example, a power generating device disclosed in Japanese Patent Laying-Open No. 2012-254005 (Patent Document 1) includes: a piezoelectric member formed of a piezoelectric material; a pair of electrodes provided on the piezoelectric member; a deformation member that repeatedly deforms the piezoelectric member; an inductor provided between the pair of electrodes, the inductor and a capacitance component of the piezoelectric member constituting a resonance circuit; a switch connected to the inductor in series; a voltage detecting unit that detects a voltage of the piezoelectric member; and a control unit that determines whether a first voltage detected by the voltage detecting unit is a maximal value or a minimal value.

In addition to this, power generating devices employing such a piezoelectric effect are also disclosed in, for example, Japanese Patent Laying-Open No. 2012-175712 (Patent Document 2), Japanese Patent Laying-Open No. 2012-105518 (Patent Document 3), Japanese Patent Laying-Open No. 2012-110143 (Patent Document 4), US Patent Application Publication No. 2010/0079034 (Patent Document 5), Japanese Patent Laying-Open No. 2012-65533 (Patent Document 6), and Yogesh K. Ramadass et al., "An Efficient Piezoelectric Energy Harvesting Interface Circuit Using a Bias-Flip Rectifier and Shared Inductor", IEEE JOURNAL OF SOLID-STATE CIRCUITS, VOL 45, No. 1, JANUARY 2010 (Non-Patent Document 1).

In general, when charges are generated in a piezoelectric body, mechanical force is generated due to an inverse piezoelectric effect. Depending on a state of distribution of the charges generated in the piezoelectric body, this force can act in a direction that hinders vibration of the piezoelectric body. Moreover, the magnitude of this force is proportional to an amount of the charges generated in the piezoelectric body. As the amplitude of vibration of the piezoelectric body is increased, the amount of the charges generated in the piezoelectric body is increased, but the force generated due to the inverse piezoelectric effect is also increased. Disadvantageously, this leads to a decreased amount of electric power generated by the power generating device.

SUMMARY OF THE INVENTION

The present invention provides a power generating device including a piezoelectric body that attains high power generation efficiency. A power generating device according to an aspect of the present invention includes a power generating unit configured to generate electric power by way of vibration externally applied. The power generating unit includes a piezoelectric body that is deformed by the vibration to generate a voltage according to an amount of deformation, and a pair of electrodes formed on surfaces of the piezoelectric body. The power generating device further includes an inductor, a switch connected to the inductor in series, and a control circuit configured to control the switch. The inductor is electrically connected to the pair of electrodes in parallel, the inductor and a capacitance component of the piezoelectric body constituting a resonance circuit. The control circuit has a first control mode and a second control mode, the control circuit controlling the switch to an ON state in the first control mode in synchronism with a timing at which the voltage generated in the piezoelectric body has a peak value, the control circuit controlling the switch to an OFF state in the second control mode at the timing at which the voltage generated in the piezoelectric body becomes the peak value. The control circuit performs the control of the second control mode during the control of the first control mode when a frequency of the vibration corresponds to a natural frequency of the power generating unit.

Preferably, in the first control mode, the control circuit controls the switch to be in the ON state during a period of an odd multiple of ½ of a resonance cycle of the resonance circuit.

Preferably, the power generating device further includes a rectifying circuit connected between the pair of electrodes in parallel and configured to rectify a voltage between the pair of electrodes, and a power storage unit configured to store the voltage rectified by the rectifying circuit.

Preferably, the power generating device further includes a voltage detecting unit configured to detect the voltage between the pair of electrodes. The control circuit performs the control of the second control mode when the amplitude of the voltage detected by the voltage detecting unit falls below a predetermined reference value.

Preferably, the power generating device further includes a displacement detecting unit configured to detect displacement of the power generating unit. The control circuit performs the control of the second control mode when the amplitude of the displacement detected by the displacement detecting unit falls below a predetermined reference value.

According to the present invention, the efficiency of power generation of the power generating device including the piezoelectric body is increased.

BRIEF DESCRIPTION OF DRAWINGS

FIG. 11 illustrates the switching control at the natural frequency of the power generating unit in the power generating device according to the first embodiment of the present invention.

FIG. 12 illustrates switching control at the natural frequency of a power generating unit in a power generating device according to a second embodiment of the present invention.

DETAILED DESCRIPTION OF THE EXEMPLARY EMBODIMENTS

Figure 1:
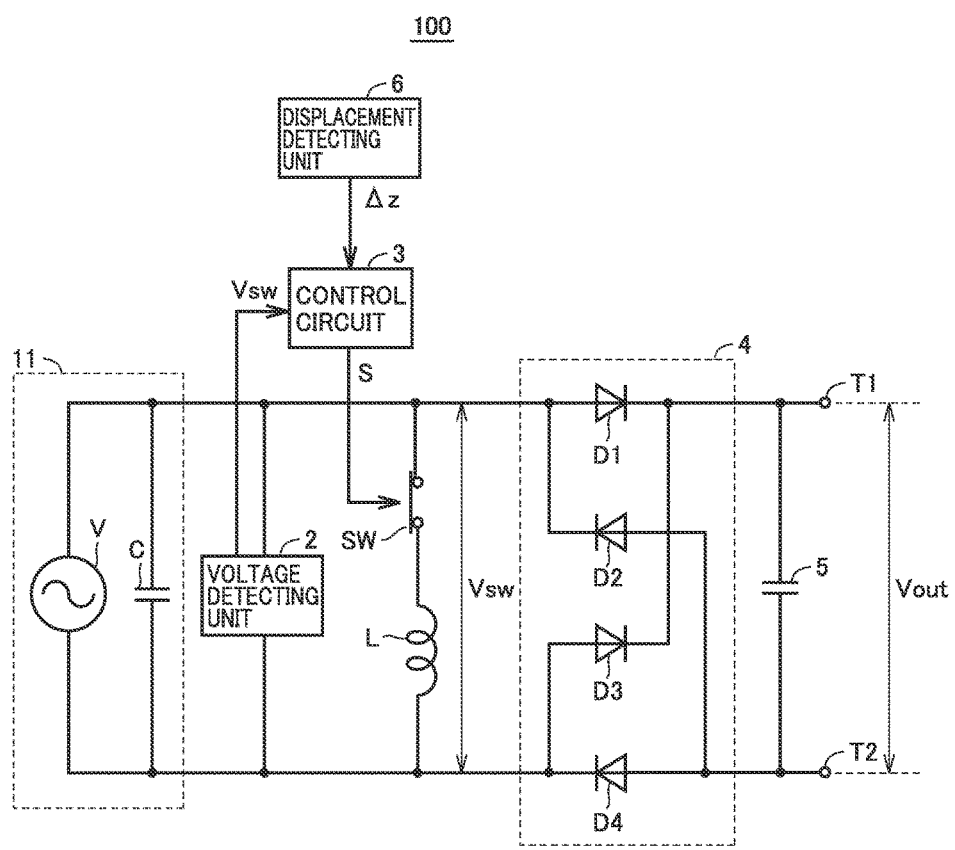
FIG. 1 is a circuit diagram schematically showing a configuration of a power generating device according to a first embodiment of the present invention.

The disclosure herein describes an exemplary embodiment of the present invention in detail with reference to figures. It should be noted that the same or corresponding portions are given the same reference characters and are not described repeatedly.

First Embodiment

<Configuration of Power Generating Device>

Figure 2A:
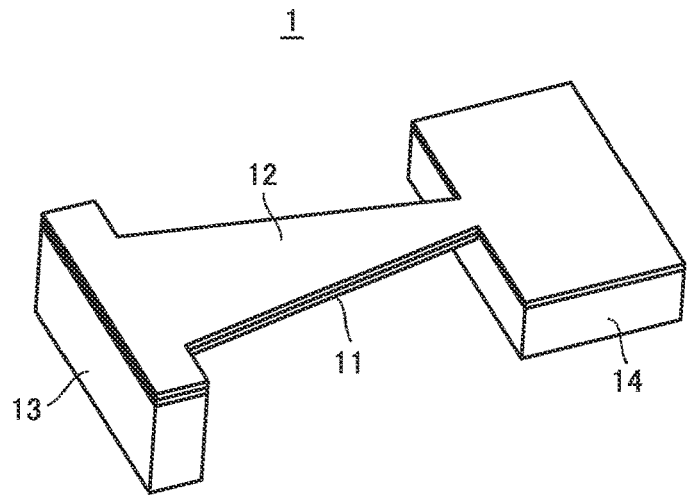
FIG. 2A is a perspective view schematically showing a configuration of a power generating unit shown in FIG. 1.
Figure 2B:
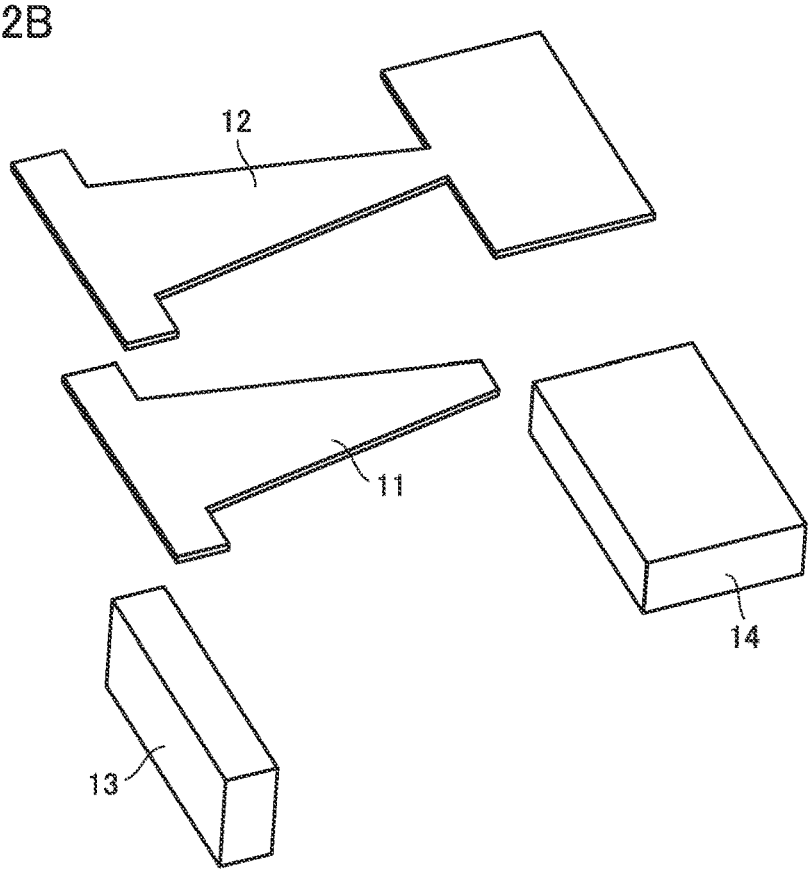
FIG. 2B is an exploded view schematically showing the configuration of the power generating unit shown in FIG. 1.
Figure 3:
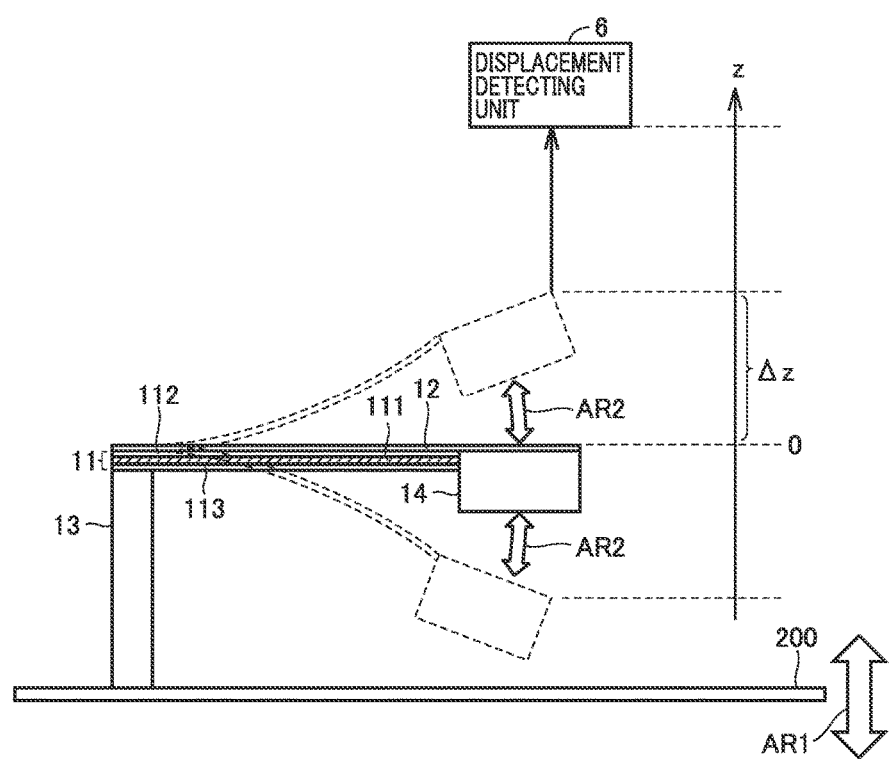
FIG. 3 illustrates a vibration operation of the power generating unit shown in FIG. 1.

FIG. 1 is a circuit diagram schematically showing a configuration of a power generating device according to a first embodiment of the present invention. FIG. 2A is a perspective view schematically showing a configuration of a power generating unit shown in FIG. 1. FIG. 2B is an exploded view schematically showing the configuration of the power generating unit shown in FIG. 1. FIG. 3 illustrates how power generating unit 1 shown in FIG. 1 is vibrated.

With reference to FIG. 1 to FIG. 3, power generating device 100 includes a power generating unit 1 (see, for example FIG. 2A), an inductor L, a voltage detecting unit 2, a control circuit 3, a switch SW, a rectifying circuit 4, a power storage unit 5, output terminals T1, T2, and a displacement detecting unit 6.

Power generating unit 1 is provided on a vibrator 200 for applying vibration to power generating unit 1. Power generating unit 1 generates electric power by way of the vibration applied by vibrator 200. Power generating unit 1 includes a piezoelectric element 11, a metal plate 12, a supporting portion 13, and a weight 14.

Piezoelectric element 11 is a unimorph type piezoelectric element, for example. Metal plate 12 is adhered to one surface of a piezoelectric body 111. Piezoelectric element 11 has piezoelectric body 111, an upper electrode 112, and a lower electrode 113.

Piezoelectric body 111 is a piezoelectric material in the form of a thin plate. For the piezoelectric material, lead zirconate titanate (PZT), crystal quartz ($SiO_2$), or zinc oxide (ZnO) can be used, for example. Upper electrode 112 and lower electrode 113 are formed on the surfaces of piezoelectric body 111 to sandwich piezoelectric body 111 therebetween. It should be noted that upper electrode 112 and lower electrode 113 correspond to a "pair of electrodes" as described herein.

Piezoelectric element 11 has a cantilever structure, for example. In other words, one end of piezoelectric element 11 is a fixed end and is attached to supporting portion 13. Supporting portion 13 is fixed onto vibrator 200. The other end of piezoelectric element 11 is a free end to which weight 14 is attached.

Power generating unit 1 is fed with vibration in a vertical direction (z direction) by vibrator 200 (as indicated by an arrow AR1 in the figure). Accordingly, weight 14 is vibrated in the z direction (as indicated by arrows AR2 in the figure). Assuming that the position of weight 14 when no vibration is applied is a reference, displacement of weight 14 is indicated by $\Delta z$. Piezoelectric body 111 is deformed according to the vibration of weight 14. As a result, a voltage Vp according to an amount of the deformation of piezoelectric body 111 is generated between upper electrode 112 and lower electrodes 113 due to a piezoelectric effect.

As shown in FIG. 1, piezoelectric element 11 is indicated as an equivalent circuit where voltage source V and a capacitor C are connected in parallel to each other. Voltage source V generates voltage Vp. Capacitor C corresponds to a capacitance component of piezoelectric body 111. It should be noted that piezoelectric element 11 is not limited to the one indicated by the equivalent circuit and that the equivalent circuit shown in FIG. 1 is an exemplary embodiment.

As shown inductor L is connected to capacitor C in parallel. In other words, capacitor C is electrically connected between upper electrode 112 and lower electrode 113 in parallel. Accordingly, inductor L and capacitor C constitute an LC resonance circuit.

Voltage detecting unit 2 is connected to capacitor C in parallel. Voltage detecting unit 2 includes an A/D converter (not shown), for example. Voltage detecting unit 2 detects a voltage Vsw between upper electrode 112 and lower electrode 113, and outputs the value of detected voltage Vsw to control circuit 3.

Control circuit 3 is a microcomputer, for example. According to an exemplary embodiment, the microcomputer can include a computer processing unit for carrying out computational processes and electronic memory for storing the various types of data such as computational results. Based on the value of voltage Vsw received from voltage detecting unit 2, control circuit 3 outputs a conduction signal S to switch SW.

Switch SW is connected to inductor L in series. In response to conduction signal S from control circuit 3, switch SW is switched from the OFF state to the ON state.

Rectifying circuit 4 is connected to capacitor C in parallel. Rectifying circuit 4 includes diodes D1 to D4, which constitute a bridge type full wave rectifying circuit, for example. A voltage Vout, rectified by rectifying circuit 4, is output between output terminals T1, T2.

Power storage unit 5 is connected between output terminals T1, T2 in parallel. Power storage unit 5 stores voltage rectified by rectifying circuit 4. For power storage unit 5, a well-known secondary battery, capacitor, or condenser can be used, for example.

Displacement detecting unit 6 is provided above weight 14 in the z direction, for example. Displacement detecting unit 6 electrically or optically measures displacement $\Delta z$ of weight 14, and outputs the value of displacement $\Delta z$ to control circuit 3.

For example, in piezoelectric element 11, a cutoff portion can be provided at part of each of upper electrode 112 and lower electrode 113. Accordingly, the cutoff portion is electrically separated from the portion of piezoelectric element 11 for generating electric power. As piezoelectric element 11 is vibrated, a voltage corresponding to strain caused in piezoelectric element 11 is generated at the cutoff portion. By detecting this voltage, the displacement of piezoelectric element 11 can be detected. Meanwhile, for optical measurement of displacement $\Delta z$, a laser displacement gauge may be used, for example.

<Switching Control by Control Circuit>

Figure 4:
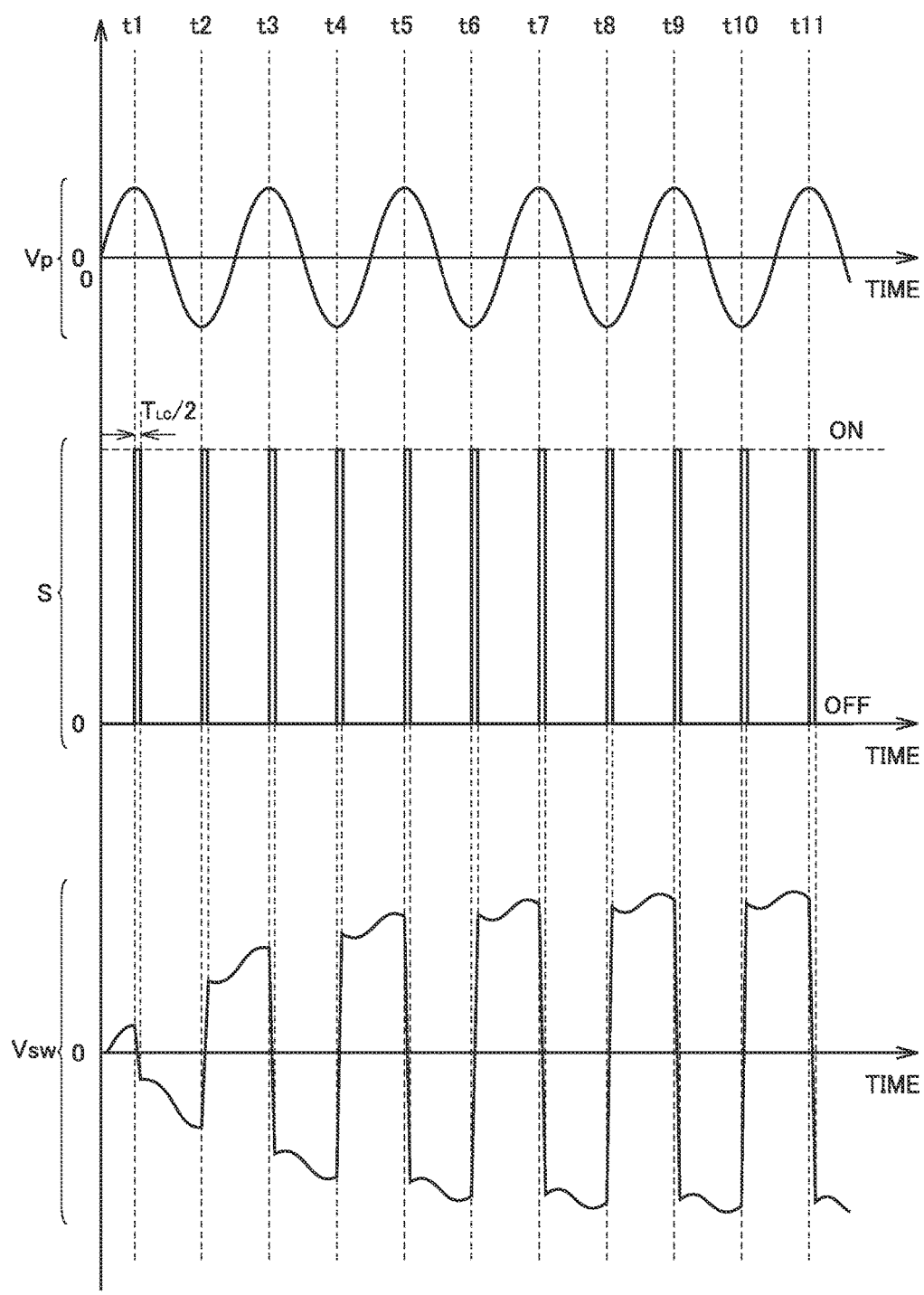
FIG. 4 illustrates switching control by a control circuit shown in FIG. 1.
Figure 5:
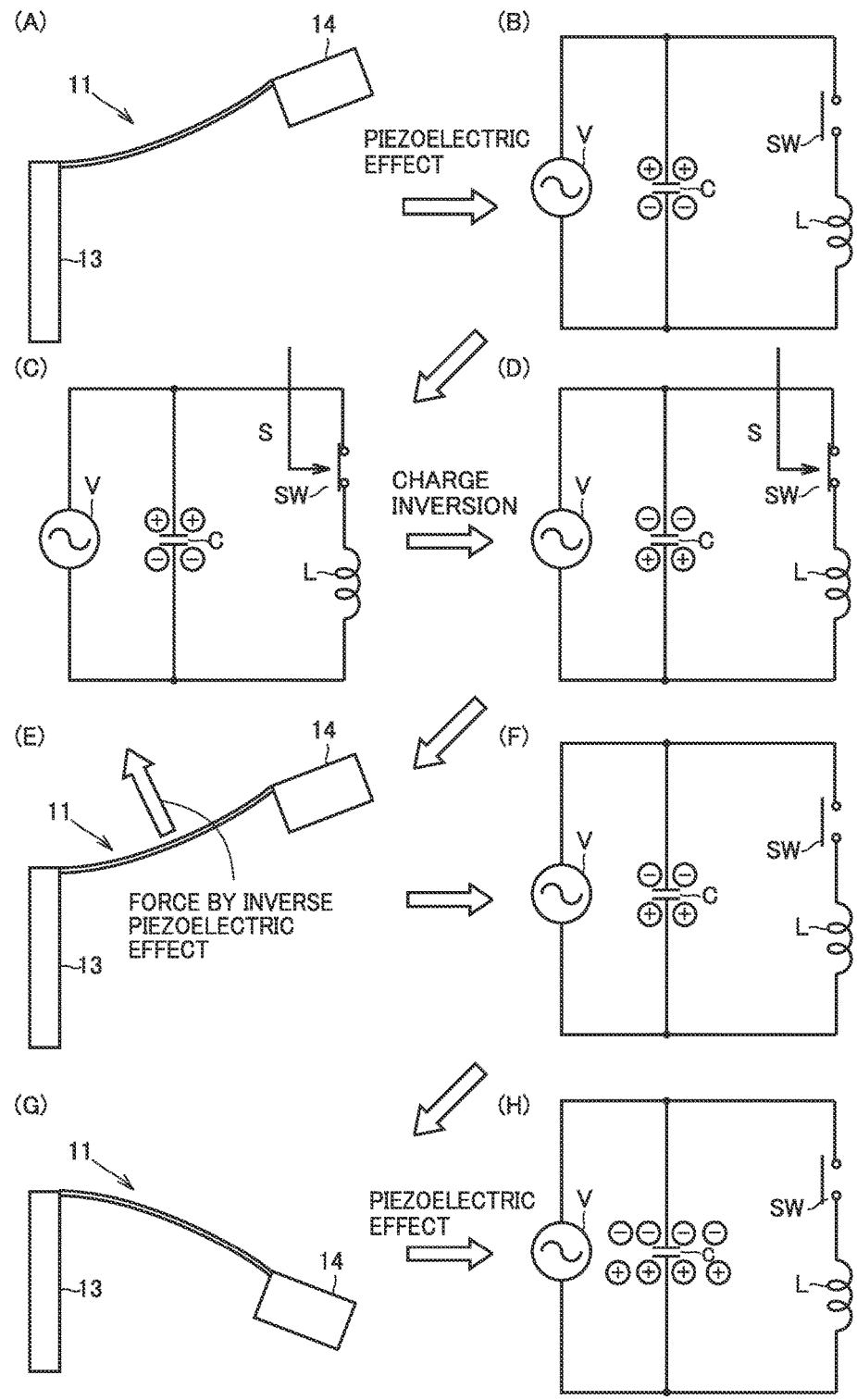
FIG. 5 illustrates resonance of a resonance circuit in the switching control shown in FIG. 4.

FIG. 4 illustrates switching control by control circuit 3 shown in FIG. 1. With reference to FIG. 4, the horizontal axis represents a time axis where time at which vibration applied to power generating unit 1 is starts as 0. The vertical axis represents voltage Vp, conduction signal S, and voltage Vsw. FIG. 5 illustrates resonance of the resonance circuit in the switching control shown in FIG. 4.

With reference to FIG. 4 and FIG. 5, vibration of sinusoidal wave is applied to power generating unit 1, for example. Accordingly, voltage source V generates voltage Vp of sinusoidal wave. It should be noted that the vibration applied to power generating unit 1 is not limited to that of the sinusoidal wave and may be, for example, vibration of saw-tooth wave as long as the frequency thereof is constant and has a peak value.

During a period of time 0 to time t1, weight 14 is displaced in the positive z direction. That is, piezoelectric element 11 is deformed in such a direction that the upper electrode 112 side of piezoelectric body 111 is depressed (see FIG. 5 (A)). The deformation of piezoelectric body 111 provides a piezoelectric effect to store positive charges at the surface of piezoelectric body 111 facing upper electrode 112 and to store negative charges at the surface of piezoelectric body 111 facing lower electrode 113. Therefore, the voltage of capacitor C is positive (see FIG. 5 (B)).

At time t1, the amplitude of displacement $\Delta z$ of weight 14 is maximum. Accordingly, voltage Vsw has a maximal value. Control circuit 3 receives the value of voltage Vsw from voltage detecting unit 2. Control circuit 3 outputs conduction signal S in synchronism with the timing at which voltage Vsw has a peak value (maximal value or minimal value), i.e., the timing at which voltage Vp has the peak value. In response to conduction signal S, switch SW is switched from the OFF state to the ON state (see FIG. 5 (C)).

Inductor L and capacitor C constitute the LC resonance circuit. When switch SW is brought into the ON state, the LC resonance circuit is resonated and the voltage across capacitor C is inverted to alternately be positive and negative. Conduction signal S is output during a period of ½ of this resonance cycle TLC of the LC resonance circuit. It should be noted that in order to invert the voltage of capacitor C, the period during which conduction signal S is output may be a period of an odd multiple of ½ of resonance cycle TLC.

At time (t1+TLC/2), the voltage of capacitor C is negative (see FIG. 5 (D)). In comparison with the state just before bringing switch SW into the ON state, this state corresponds to a state in which the charges stored at the upper electrode 112 side of piezoelectric body 111 are replaced with the charges stored at the lower electrode 113 side thereof. In the present specification, a phenomenon of inversion of distribution of charges of piezoelectric body 111 as caused by the switching control performed by control circuit 3 is referred to as "charge inversion". Ideally, the amplitude of voltage Vsw before the charge inversion at time t1 is equal to the amplitude of voltage Vsw after the charge inversion at time (t1+TLC/2). When the output of conduction signal S from control circuit 3 ends, the control circuit 3 switches switch SW from the ON state to the OFF state (see FIG. 5 (F)).

At time t2, weight 14 is displaced in the negative z direction. As a result, piezoelectric element 11 is deformed in such a direction that the lower electrode 113 side of piezoelectric body 111 is depressed (see FIG. 5 (G)). The deformation of piezoelectric body 111 provides a piezoelectric effect to store new negative charges at the surface of piezoelectric body 111 facing upper electrode 112 and to store new positive charges at the surface of piezoelectric body 111 facing lower electrode 113 (see FIG. 5 (H)). Accordingly, the amplitude of voltage Vsw at time t2 is larger than the amplitude of voltage Vsw at time t1.

Control circuit 3 outputs conduction signal S in synchronism with the timing at which voltage Vsw has the minimal value. An effect provided by the resonance of the LC resonance circuit during a period after time t2 till time (t2+TLC/2) is similar to the effect provided during the period after time t1 till time (t1+TLC/2) although the polarities of the charges are opposite, and is therefore not described in detail repeatedly.

During a period after time t2 till time t6, the amplitude of voltage Vsw is increased for every half cycle of the vibration of piezoelectric body 111. Accordingly, voltage Vsw higher than voltage Vp generated by voltage source V can be obtained. Hence, voltage Vout can be higher than that in the case where the switching control is not performed, whereby the amount of electric power generated by power generating device 100 can be increased.

During a period after time t6, the increase in amplitude of voltage Vsw is stopped. This is mainly due to loss resulting from conduction resistance of switch SW and loss resulting from internal resistance of inductor L. The amplitude of voltage Vsw when the increase in amplitude is stopped is about 4 times to 5 times as large as the amplitude of voltage Vsw at time t1.

Resonance cycle TLC of the LC resonance circuit is sufficiently shorter than the cycle of the vibration applied to power generating unit 1. Hence, for example, when piezoelectric body 111 is deformed in such a direction that the upper electrode 112 side of piezoelectric body 111 is depressed, the upper electrode 112 side of piezoelectric body 111 is still depressed even after the charge inversion. When the charge inversion takes place, force for deforming it, such that the lower electrode 113 side is depressed, is generated in piezoelectric body 111 by the inverse piezoelectric effect (see FIG. 5 (E)). That is, the direction of this force is a direction of hindering piezoelectric body 111 from being deformed by the vibration applied by vibrator 200. In the present disclosure, such an effect of attenuating the vibration of power generating unit 1 by the inverse piezoelectric effect will be referred to as "damping effect by charge inversion".

<Damping Effect by Charge Inversion>

Figure 6:
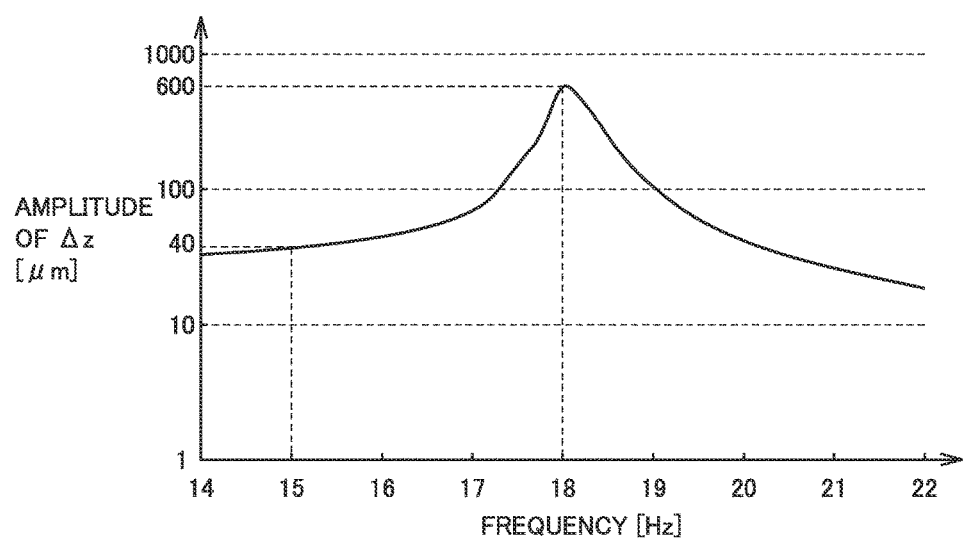
FIG. 6 shows frequency dependency of the amplitude of displacement of a weight.

FIG. 6 shows frequency dependency of the amplitude of displacement $\Delta z$ of weight 14. With reference to FIG. 6, the horizontal axis represents a frequency f of the vibration applied to power generating unit 1. The vertical axis represents the amplitude of displacement $\Delta z$ of weight 14.

Power generating unit 1 has a natural frequency f0 of 18 Hz, for example. When frequency f corresponds to natural frequency f0=18 Hz, the amplitude of displacement $\Delta z$ has a maximum value of 600 μm. On the other hand, the amplitude of displacement $\Delta z$ is 40 μm when frequency f is different from natural frequency f0, for example, when frequency f is 15 Hz.

Thus, the amplitude of displacement Δz is remarkably large when frequency f of vibration applied to power generating unit 1 corresponds to natural frequency f0 of power generating unit 1. Therefore, in order to obtain the maximum amount of generated electric power, it is desirable to apply vibration of natural frequency f0 to power generating unit 1. However, as described in detail below, the damping effect by charge inversion provides greatly different behaviors of voltage Vsw and displacement Δz of weight 14 between the case where frequency f corresponds to natural frequency f0 and the case where frequency f is different therefrom.

Figure 7:
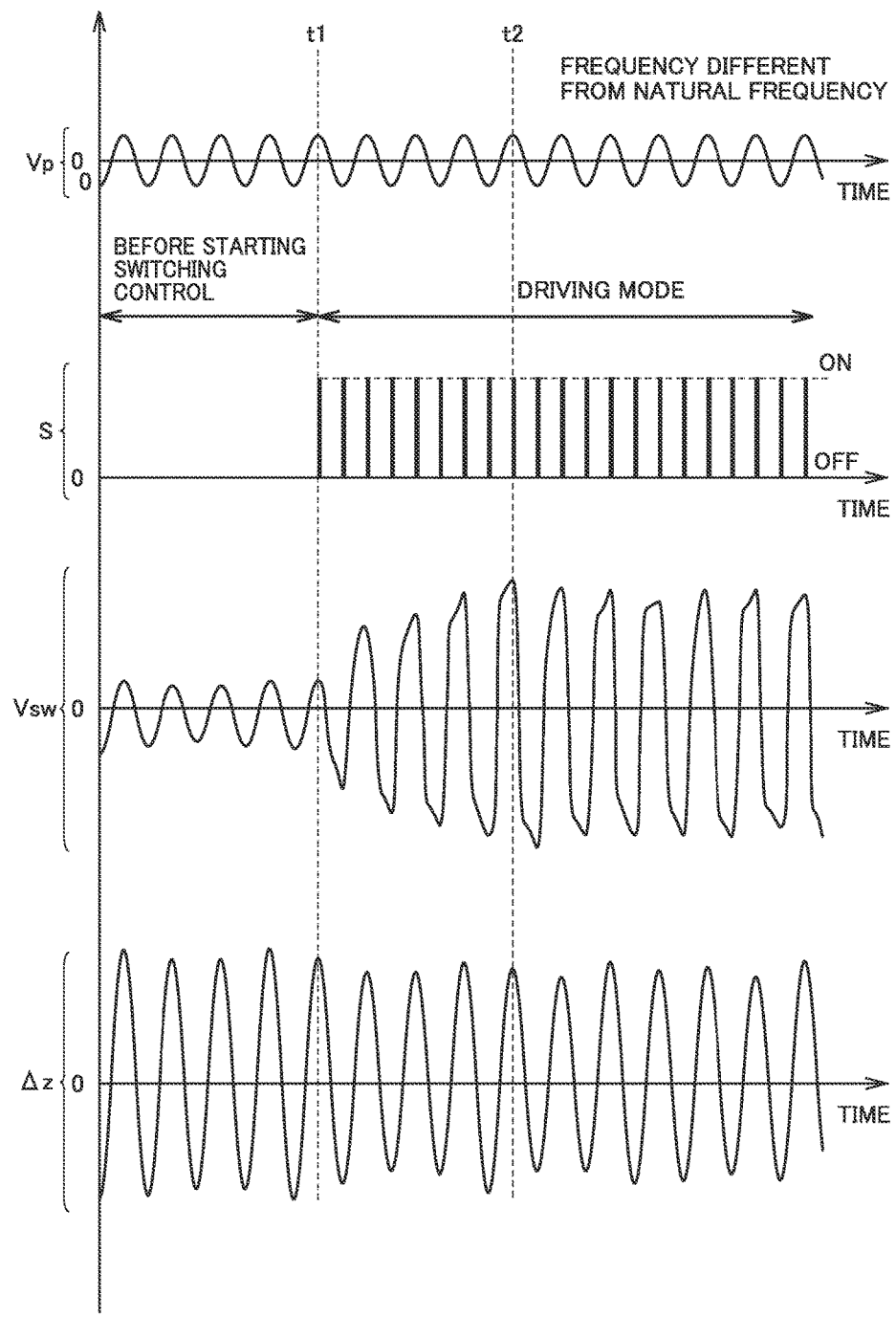
FIG. 7 shows voltage and displacement of the weight when the frequency of vibration applied to the power generating unit is different from a natural frequency.
Figure 8:
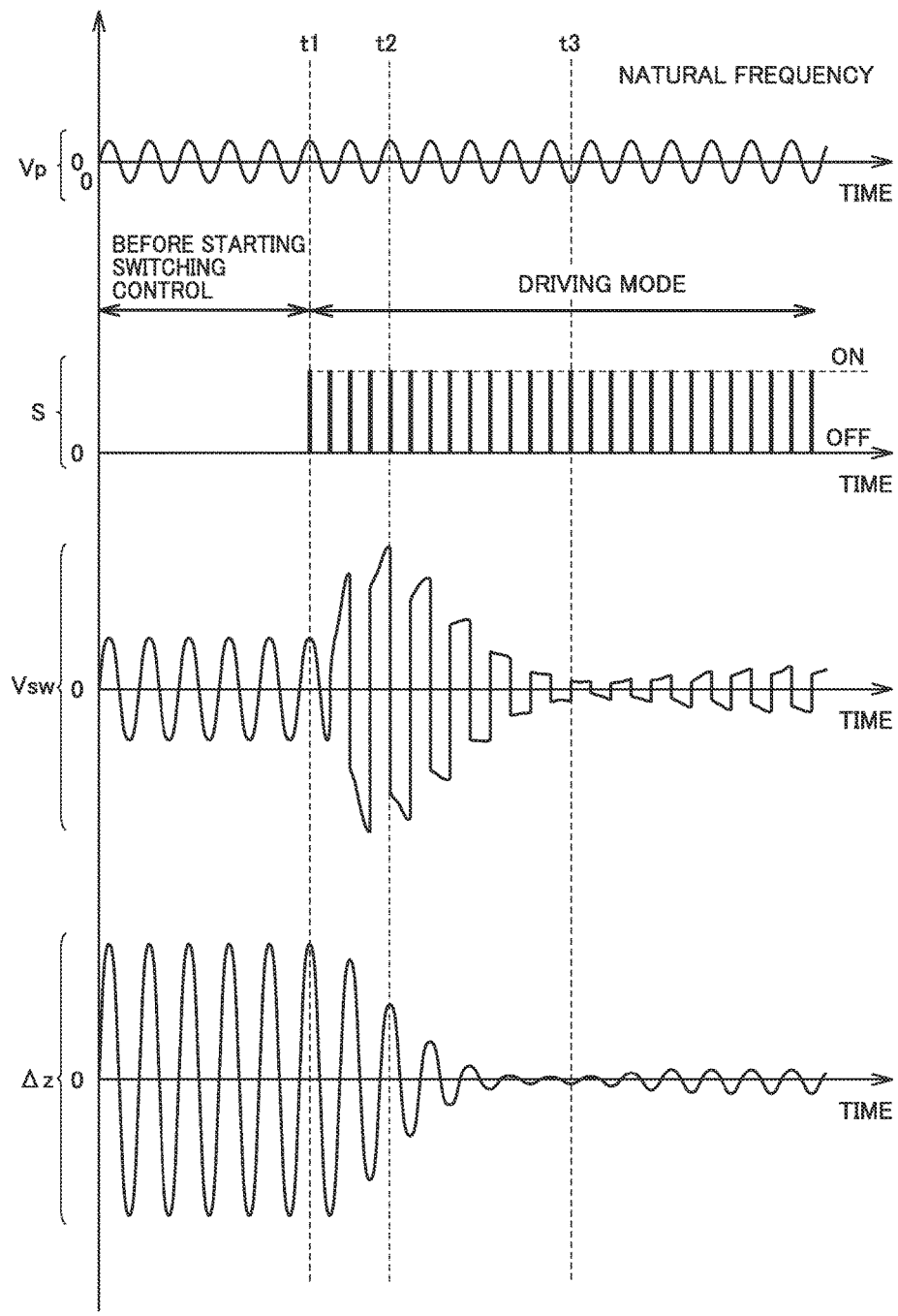
FIG. 8 shows the voltage and the displacement of the weight when the vibration of natural frequency is applied to the power generating unit.

FIG. 7 shows voltage Vsw and displacement Δz of weight 14 in the case where frequency f of the vibration applied to power generating unit 1 is different from natural frequency f0. FIG. 8 shows voltage Vsw and displacement Δz of weight 14 in the case where frequency f of the vibration applied to power generating unit 1 corresponds to natural frequency f0. With reference to FIG. 7 and FIG. 8, the horizontal axis presents a time axis. The vertical axis represents voltage Vp, conduction signal S, voltage Vsw, and displacement Δz.

With reference to FIG. 7, vibration of sinusoidal wave of 15 Hz different from natural frequency f0 is applied to power generating unit 1. Accordingly, voltage source V generates voltage Vp of sinusoidal wave of 15 Hz.

At time t1, the switching control by control circuit 3 is started. Control circuit 3 outputs conduction signal S in synchronism with a timing at which voltage Vp has a peak value.

At time t2 for which time has passed by four cycles since time t1, the amplitude of voltage Vsw is about three times as large as the amplitude thereof before the start of the switching control. Thus, the amplitude of voltage Vsw is increased gradually during some cycles from the start of the switching control. After time t2, the amplitude of voltage Vsw is kept substantially constant.

On the other hand, the amplitude of displacement Δz of weight 14 is hardly changed irrespective of whether or not the switching control of switch SW is performed. From this result, it is understood that when frequency f of the vibration applied to power generating unit 1 is different from natural frequency f0, displacement Δ of weight 14 is hardly influenced by the damping effect by charge inversion.

On the other hand, with reference to FIG. 8, vibration of sinusoidal wave of natural frequency f0=18 Hz is applied to power generating unit 1. Accordingly, voltage source V generates voltage Vp of sinusoidal wave of 18 Hz.

During a period after time t1 till time t2, the amplitude of voltage Vsw is abruptly increased. However, the amplitude of voltage Vsw is decreased gradually after time t2. After time t3, the amplitude of voltage Vsw becomes substantially constant at about ½ of the amplitude thereof before the start of the switching control.

Moreover, the amplitude of displacement Δz of weight 14 is decreased gradually after time t1. At time t3, the amplitude of displacement Δz is reduced significantly to about 1/10 of the amplitude thereof before the start of the switching control.

The following explains why voltage Vsw and displacement Δz of weight 14 exhibit the above-described behaviors. When frequency f corresponds to natural frequency f0, resonance takes place in power generating unit 1. With the resonance thus taking place, the amplitude of displacement Δz is remarkably large and is increased to be Q times as large as the amplitude thereof when no resonance takes place. Specifically, the amplitude (600 μm) of displacement Δz at natural frequency f0=18 Hz is Q=15 times as large as the amplitude (40 μm) at 15 Hz (see FIG. 6).

The amount of charges generated by piezoelectric body 111 is proportional to the amplitude of displacement Δz of weight 14. Accordingly, in piezoelectric body 111 during the resonance, charges are generated Q times as large as those when no resonance takes place. In piezoelectric body 111, force Q times as large as that when no resonance takes place is generated due to the inverse piezoelectric effect. Hence, at natural frequency f0, the influence of the damping effect by charge inversion over displacement Δ is remarkably larger than that in the case of a frequency different from natural frequency f0.

Figure 9:
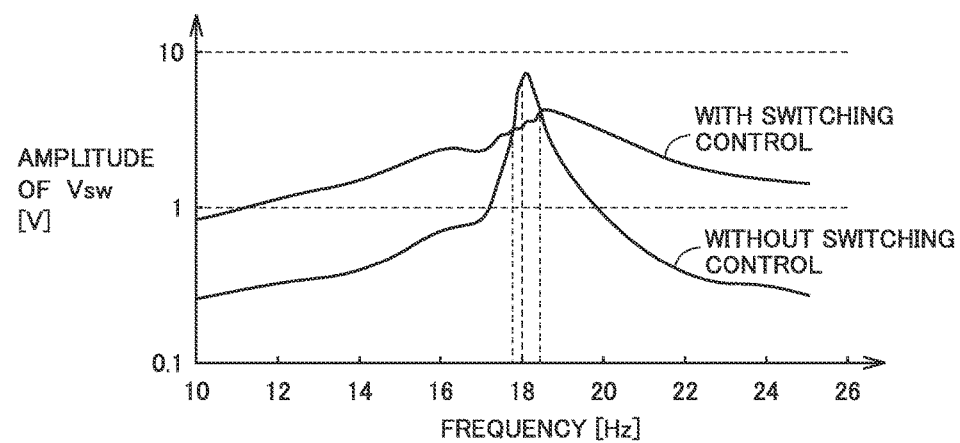
FIG. 9 shows frequency dependency of influence of a damping effect over the amplitude of the voltage.

FIG. 9 shows frequency dependency of the influence of the damping effect over the amplitude of voltage Vsw. With reference to FIG. 9, the horizontal axis represents frequency f of the vibration applied to power generating unit 1. The vertical axis represents the amplitude of voltage Vsw.

When no switching control is performed, the amplitude of voltage Vsw becomes maximum at natural frequency f0=18 Hz.

When the switching control is performed, in a frequency region including natural frequency f0=18 Hz, the amplitude of voltage Vsw is smaller than the amplitude thereof in the case where no switching control is performed. In the present embodiment, a region of natural frequency f0±2.5% represents the frequency region in which the amplitude of voltage Vsw in the case where the switching control is performed is smaller than the amplitude thereof in the case where no switching control is performed.

Figure 10:
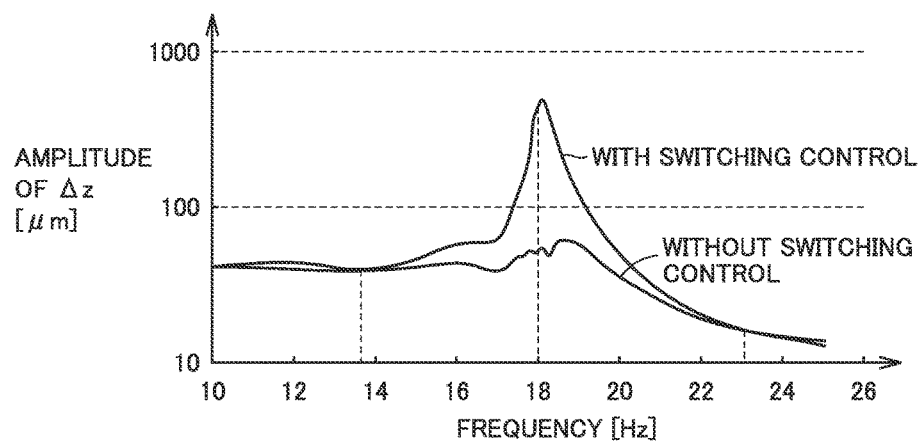
FIG. 10 shows frequency dependency of influence of the damping effect over the amplitude of the displacement of the weight.

FIG. 10 shows frequency dependency of the influence of the damping effect over the amplitude of displacement Δz of weight 14. With reference to FIG. 10, the horizontal axis represents frequency f of the vibration applied to power generating unit 1. The vertical axis represents the amplitude of displacement Δz.

In the case where no switching control is performed, the amplitude of displacement Δz becomes maximum at natural frequency f0=18 Hz. In the frequency region of natural frequency f0±15%, the amplitude of displacement Δz in the case where the switching control is performed is less than the amplitude thereof in the case where no switching control is performed.

As described above, it is understood that vibration frequencies involving a large influence of the damping effect by charge inversion extend over a frequency region having a certain width from natural frequency f0 that is regarded as the center.

<Switching Control at Natural Frequency>

Referring back to FIG. 8, even when vibration of natural frequency f0 is applied to power generating unit 1, voltage Vsw is increased during a certain period from the start of the switching control (period after time t1 till time t2). In the present embodiment, control circuit 3 employs this characteristic to perform the switching control.

FIG. 11 illustrates the switching control at natural frequency f0 of power generating unit 1 in power generating device 100 according to the first embodiment of the present invention. With reference to FIG. 11, FIG. 11 is compared with FIG. 8.

As modes for performing the switching control of switch SW, control circuit 3 has a driving mode (first control mode) and a rest mode (second control mode). In the driving mode, control circuit 3 outputs conduction signal S in synchronism with a timing at which voltage Vp generated in piezoelectric body 111 becomes a peak value. Accordingly, switch SW is brought into the ON state. On the other hand, in the rest mode, the control circuit does not output conduction signal S at the timing at which voltage Vp has the peak value. Namely, switch SW is in the OFF state during the rest mode.

The period after time 0 till time t1 is the period before the start of the switching control by control circuit 3. At time t1, control circuit 3 starts the switching control.

During a period after time t1 till time t4 for which time has passed by three times (3T0) as large as cycle T0 since time t1, control circuit 3 controls switch SW in accordance with the driving mode.

At time t4, the detection value of voltage Vsw is below a predetermined reference value V1. Hence, during a period after time t4 till time t5 for which time has passed by cycle T0 since time t4, switch SW is controlled in accordance with the rest mode. In other words, the control of the rest mode is started to be performed during the control of the driving mode.

During the period after time t5 till time t6 for which time has passed by cycle T0 since time t5, control circuit 3 controls switch SW in accordance with the driving mode. During a period after time t6 till time t7 for which time has passed by cycle T0 since time t6, control circuit 3 controls switch SW in accordance with the rest mode. That is, control circuit 3 performs the control of the rest mode during the control of the driving mode. The switching control by control circuit 3 after time t7 is the same as the switching control during the period after time t5 till time t7, and is therefore not described repeatedly.

Thus, control circuit 3 alternately repeats the driving mode having a length corresponding to cycle T0 of the vibration applied to power generating unit 1 and the rest mode having a length corresponding to cycle T0. It should be noted that control circuit 3 may perform the switching control irrespective of whether or not the detection value of voltage Vsw falls below reference value V1. In this case, control circuit 3 alternately repeats the driving mode and the rest mode immediately after the start of the switching control at time t1.

Moreover, control circuit 3 may start to perform the rest mode when the amplitude of displacement Δz of weight 14 detected by displacement detecting unit 6 falls below predetermined reference value z1.

As described with reference to FIG. 8, during some cycles immediately after the start of the switching control, the amplitude of voltage Vsw is larger than the amplitude thereof before the start of the switching control. Moreover, from the start of the switching control, it takes a certain amount of time for the amplitude of voltage Vsw to start to decrease. According to the present embodiment, control circuit 3 performs the control of the rest mode before the amplitude of voltage Vsw starts to be decreased. Hence, the amplitude of voltage Vsw can be larger than that in the case where the switching control is not performed.

Moreover, after starting the switching control, it takes a certain amount of time till the amplitude of displacement Δz of weight 14 is significantly decreased (see FIG. 8). Therefore, control circuit 3 performs the control of the rest mode before the amplitude of displacement Δz is significantly decreased. Accordingly, it is possible to prevent the amplitude of displacement Δz from being significantly decreased to result in a decreased amount of electric power generated by power generating device 100. That is, the power generation efficiency of power generating device 100 can be increased.

Second Embodiment

FIG. 12 illustrates switching control at natural frequency f0 of power generating unit 1 in a power generating device according to a second embodiment of the present invention. With reference to FIG. 12, FIG. 12 is compared with FIG. 8 and FIG. 11. It should be noted that the configuration of the power generating device according to the second embodiment is similar to the configuration of power generating device 100 (see FIG. 1) and is therefore not described repeatedly in detail.

At time t1, control circuit 3 starts the switching control. The detection value of voltage Vsw at time t1 is below reference value V1. Hence, during the period after time t1 till time t2 for which time has passed by cycle T0 since time t1, control circuit 3 controls switch SW in accordance with the driving mode.

During the period after time t2 till time t3 for which time has passed by 3T0 since time t2, control circuit 3 performs the control of the rest mode during the control of the driving mode. The switching control by control circuit 3 after time t3 is similar to the switching control during the period after time t1 till time t3, and is therefore not described repeatedly.

Thus, control circuit 3 alternately repeats the driving mode having a length corresponding to cycle T0 of the vibration applied to power generating unit 1, and the rest mode having a length corresponding to 3 times as large as cycle T0.

It should be noted that control circuit 3 may perform the switching control irrespective of whether or not the detection value of voltage Vsw falls below reference value V1. Moreover, control circuit 3 may start to insert the rest mode when the amplitude of displacement Δz of weight 14 detected by displacement detecting unit 6 falls below predetermined reference value z1.

According to the present embodiment, the amplitude of voltage Vsw after the start of the switching control is about twice as large as the amplitude thereof before the start of the switching control. Moreover, the amplitude of displacement Δz of weight 14 after the start of the switching control is about ⅔ of the amplitude thereof before the start of the switching. In other words, the amount of decrease of the amplitude of displacement Δz can be reduced to about ⅓ of the amplitude thereof before the start of the switching. Therefore, as with the first embodiment, the amount of electric power generated by the power generating device can be prevented from being decreased. That is, the power generation efficiency of the power generating device can be increased.

Figures 13A, 13B:
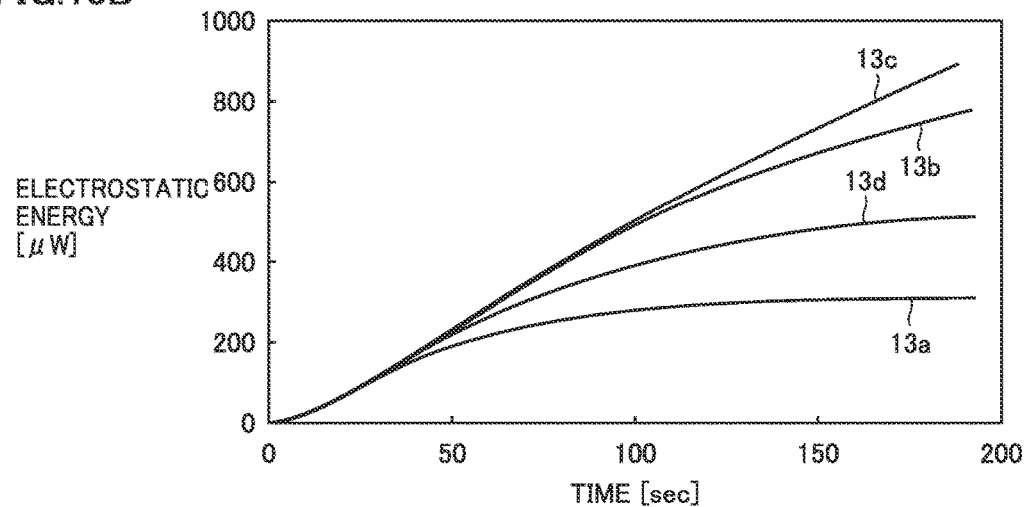
FIG. 13A shows conditions for comparison of electrostatic energy stored in the power storage unit shown in FIG. 1.
FIG. 13B is a diagram for comparison of the electrostatic energy stored in the power storage unit shown in FIG. 1.

FIG. 13A shows conditions for comparison of electrostatic energy stored in the power storage unit shown in FIG. 1. FIG. 13B is a diagram for comparison of the electrostatic energy stored in the power storage unit shown in FIG. 1. With reference to FIG. 13A and FIG. 13B, the horizontal axis represents time having passed since the start of storing energy in power storage unit 5. The vertical axis represents electrostatic energy U stored in power storage unit 5. Vibration of natural frequency f0 is applied to power generating unit 1.

A waveform 13a represents electrostatic energy U in the case where the switching control is always in the driving period (see FIG. 8). A waveform 13b represents electrostatic energy U in the first embodiment (see FIG. 11). A waveform 13c represents electrostatic energy U in the second embodiment (see FIG. 12). A waveform 13d represents electrostatic energy U in the case where the switching control is not performed (or the switching control is always in the rest period).

For power storage unit 5, an electrolytic capacitor having a capacitance $C_5 = 47$ ρf is used, for example. Electrostatic energy U is determined in accordance with the following relational expression: $U=\frac{1}{2} \times C5 \times Vout^2$.

Electrostatic energy U in the case where the switching control is always in the driving mode (see waveform 13a) is about 60% with respect to a reference, i.e., electrostatic energy U in the case where no switching control is performed at the same time (see waveform 13d). Thus, when the switching control is always performed in the driving mode, the damping effect by charge inversion causes electrostatic energy U to be smaller than that in the case where the switching control is not performed.

On the other hand, electrostatic energy U (see waveform 13b) in the first embodiment is about 150% with respect to the same reference as that described above. Moreover, electrostatic energy U (see waveform 13c) in the second embodiment is about 180% with respect to the reference. As described above, the control of the rest mode is performed during the control of the driving mode, whereby electrostatic energy stored in power storage unit 5 can be increased.

It should be noted that the length of each of the driving mode and the rest mode is not limited to the length described in each of the first and second embodiments. The length of each of the driving mode and the rest mode can be set appropriately in consideration of: the specification of the power generating unit (such as type and structure of the piezoelectric element or the natural frequency of the power generating unit); a condition (for example, the magnitude of amplitude) for the vibration applied to the power generating unit; or the like. For example, control circuit 3 may repeat one cycle of the driving mode and two cycles of the rest mode alternately. Alternatively, control circuit 3 may repeat two cycles of the driving mode and two cycles of the rest mode alternately.

For piezoelectric element 11, a bimorph type piezoelectric element may be employed, for example. Moreover, the structure of the piezoelectric element is not particularly limited to the cantilever structure as long as the structure is such that the piezoelectric body is repeatedly deformed according to cyclic vibration. For example, the piezoelectric body may be adhered onto a surface of a thin film, or the piezoelectric body may be attached to a side surface of a coiled spring.

Furthermore, in each of the first and second embodiments, it has been illustrated that control circuit 3 performs the switching control in accordance with the driving period and the rest period each having a predetermined length. However, the timing at which control circuit 3 switches the switching control between the driving period and the rest period is not limited to this. With reference to FIG. 11 and FIG. 12, for example, control circuit 3 may insert the rest mode only when the detection value of voltage Vsw falls below predetermined reference value V1. Accordingly, the amplitude of weight 14 can be restored. Alternatively, control circuit 3 may insert the rest mode only when the amplitude of displacement Δz of weight 14 detected by displacement detecting unit 6 falls below predetermined reference value z1.

The embodiments disclosed herein are illustrative and non-restrictive in any respect. The scope of the present invention is defined by the terms of the claims, and is intended to include any modifications within the scope and meaning equivalent to the terms of the claims.

REFERENCE SIGNS LIST

100: piezoelectric device; 1: power generating unit; 11: piezoelectric element; 111: piezoelectric body; 112: upper electrode; 113: lower electrode; 12: metal plate; 13: supporting portion; 14: weight; V: voltage source; C: capacitor; 2: voltage detecting unit; 3: control circuit; SW: switch; L: inductor; 4: rectifying circuit; D1 to D4: diode; 5: power storage unit; 6: displacement detecting unit; T1, T2: output terminal.

The invention claimed is:

1. A power generating device comprising:
a power generating unit configured to generate electric power based on externally applied vibration, the power generating unit including:
a piezoelectric body deformable by the vibration to generate a voltage proportional to an amount of deformation, and
a pair of electrodes with the piezoelectric body disposed therebetween;
an inductor electrically connected to at least one of the pair of electrodes, wherein the inductor and a capacitance component of the piezoelectric body constitute a resonance circuit;
a switch connected to the inductor in series; and
a control circuit configured to control the switch to be in an ON state and an OFF state,
wherein the control circuit has a first control mode in which the control circuit controls the switch to switch from the OFF state to the ON state in synchronism with a timing at which the voltage generated in the piezoelectric body becomes a peak value,
wherein the control circuit has a second control mode in which the control circuit controls the switch to be in an OFF state regardless of the timing at which the voltage generated in the piezoelectric body becomes the peak value, and
wherein the control circuit operates in the second control mode after the first control mode when a frequency of the vibration corresponds to a natural frequency of the power generating unit.

2. The power generating device according to claim 1, wherein, in the first control mode of the control circuit, the control circuit controls the switch to be in the OFF state after controlling the switch to be in the ON state.

3. The power generating device according to claim 1, wherein, in the first control mode, the control circuit controls the switch to be in the ON state during a period of an odd multiple of ½ of a resonance cycle of the resonance circuit.

4. The power generating device according to claim 1, further comprising:
a rectifying circuit coupled in parallel to the pair of electrodes and configured to rectify a voltage between the pair of electrodes; and
a power storage unit coupled to the rectifying circuit and configured to store the rectified voltage.

5. The power generating device according to claim 1, further comprising:
a voltage detecting unit configured to detect the voltage between the pair of electrodes,
wherein the control circuit operates in the second control mode when an amplitude of the voltage detected by the voltage detecting unit is less than a predetermined reference value.

6. The power generating device according to claim 1, further comprising:
a displacement detecting unit configured to detect displacement of the power generating unit caused by the vibration,
wherein the control circuit operates in the second control mode when an amplitude of the displacement detected by the displacement detecting unit is less than a predetermined reference value.

7. The power generating device according to claim 6, wherein the displacement detecting unit is configured to measure the displacement of the power generating unit either electrically or optically.

8. The power generating device according to claim 1, wherein the power generating unit further includes a weight attached to one end of the piezoelectric element and affixed connected affixed to a vibrator of the power generating device.

9. The power generating device according to claim 8, wherein piezoelectric element comprises a cantilever structure with an end having a smaller width affixed to the weight.

10. The power generating device according to claim 1, wherein the inductor and the capacitance component of the piezoelectric body are each connected in parallel to the pair of electrodes.

11. A power generating device comprising:
   a power generating unit configured to generate electric power based on externally applied vibration, the power generating unit including:
      a piezoelectric body deformable by the vibration to generate a voltage proportional to an amount of deformation, and
      a pair of electrodes disposed on opposing surfaces of the piezoelectric body;
   an inductor electrically connected to at least one of the pair of electrodes, wherein the inductor and a capacitance component of the piezoelectric body constitute a resonance circuit;
   a switch connected in series to the inductor; and
   a control circuit that controls an ON/OFF state of the switch, the control circuit being configured to:
      operate in a first control mode that switches the switch from the OFF state to the ON state when the voltage generated in the piezoelectric body becomes a peak value, and
      operate in a second control mode that switches the switch to the OFF state regardless of whether the voltage generated in the piezoelectric body is the peak value, and
      wherein control circuit operates in the second control mode after the first control mode when a frequency of the vibration corresponds to a natural frequency of the power generating unit.

12. The power generating device according to claim 11, wherein, in the first control mode of the control circuit, the control circuit switches the switch to the OFF state after the switch is in the ON state.

13. The power generating device according to claim 11, wherein, in the first control mode, the control circuit switches the switch to be in the ON state during a period of an odd multiple of ½ of a resonance cycle of the resonance circuit.

14. The power generating device according to claim 11, further comprising:
   a rectifying circuit coupled in parallel to the pair of electrodes and configured to rectify a voltage between the pair of electrodes; and
   a power storage unit coupled to the rectifying circuit and configured to store the rectified voltage.

15. The power generating device according to claim 11, further comprising:
   a voltage detecting unit configured to detect the voltage between the pair of electrodes,
   wherein the control circuit operates in the second control mode when an amplitude of the voltage detected by the voltage detecting unit is less than a predetermined reference value.

16. The power generating device according to claim 11, further comprising:
   a displacement detecting unit configured to detect displacement of the power generating unit caused by the vibration,
   wherein the control circuit operates in the second control mode when an amplitude of the displacement detected by the displacement detecting unit is less than a predetermined reference value.

17. The power generating device according to claim 16, wherein the displacement detecting unit is configured to measure the displacement of the power generating unit either electrically or optically.

18. The power generating device according to claim 11, wherein the power generating unit further includes a weight attached to one end of the piezoelectric element and affixed connected affixed to a vibrator of the power generating device.

19. The power generating device according to claim 18, wherein piezoelectric element comprises a cantilever structure with a end having a smaller width affixed to the weight.

20. The power generating device according to claim 11, wherein the inductor and the capacitance component of the piezoelectric body are each connected in parallel to the pair of electrodes.

* * * * *